United States Patent
Matsubara et al.

(10) Patent No.: US 12,406,842 B2
(45) Date of Patent: Sep. 2, 2025

(54) SUBSTRATE PROCESSING APPARATUS AND METHOD OF PRODUCING SEMICONDUCTOR DEVICE

(71) Applicant: KIOXIA CORPORATION, Tokyo (JP)

(72) Inventors: Yuya Matsubara, Yokkaichi Mie (JP); Masayuki Kitamura, Yokkaichi Mie (JP); Atsuko Sakata, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 701 days.

(21) Appl. No.: 17/844,333

(22) Filed: Jun. 20, 2022

(65) Prior Publication Data
US 2022/0319842 A1    Oct. 6, 2022

Related U.S. Application Data

(62) Division of application No. 16/283,609, filed on Feb. 22, 2019, now Pat. No. 11,393,675.

(30) Foreign Application Priority Data

Sep. 13, 2018 (JP) ................. 2018-171649

(51) Int. Cl.
| | |
|---|---|
| *H01L 21/02* | (2006.01) |
| *C23C 16/30* | (2006.01) |
| *C23C 16/32* | (2006.01) |
| *C23C 16/50* | (2006.01) |

(Continued)

(52) U.S. Cl.
CPC ........ *H01L 21/02178* (2013.01); *C23C 16/30* (2013.01); *C23C 16/32* (2013.01); *C23C 16/50* (2013.01); *C23C 16/52* (2013.01); *H01L 21/02274* (2013.01); *H01L 21/28556* (2013.01); *H01L 21/28568* (2013.01)

(58) Field of Classification Search
CPC ..................... C23C 16/4404; H01L 21/02178
See application file for complete search history.

(56) References Cited

U.S. PATENT DOCUMENTS

| | | | |
|---|---|---|---|
| 7,713,886 B2 * | 5/2010 | Kobayashi | ............ C23C 16/405 438/785 |
| 2001/0006070 A1 * | 7/2001 | Shang | ................ C23C 16/4404 134/1 |

(Continued)

FOREIGN PATENT DOCUMENTS

| | | |
|---|---|---|
| JP | H04-191379 A | 7/1992 |
| JP | 3761040 B2 | 3/2006 |

(Continued)

*Primary Examiner* — Ali Naraghi
(74) *Attorney, Agent, or Firm* — Foley & Lardner LLP

(57) ABSTRACT

A substrate processing apparatus includes a chamber to accommodate a substrate. The apparatus includes a stage to support the substrate in the chamber. The apparatus includes an electrode disposed above the stage and containing aluminum. The electrode generates plasma from gas supplied into the chamber to form a first film on the substrate by the plasma. The apparatus further includes a second film formed on a surface of the electrode and containing aluminum and fluorine or containing aluminum and oxygen.

12 Claims, 1 Drawing Sheet

(51) Int. Cl.
  *C23C 16/52* (2006.01)
  *H01L 21/285* (2006.01)

(56) References Cited

U.S. PATENT DOCUMENTS

| | | | |
|---|---|---|---|
| 2013/0284373 A1* | 10/2013 | Sun | H01J 37/32467 |
| | | | 174/255 |
| 2017/0204514 A1* | 7/2017 | Kim | C23C 16/22 |
| 2018/0082855 A1* | 3/2018 | Sasaki | H01L 21/67069 |
| 2019/0287982 A1 | 9/2019 | Hinoue et al. | |

FOREIGN PATENT DOCUMENTS

| | | |
|---|---|---|
| JP | 3915959 B2 | 5/2007 |
| JP | 2008-078446 A | 4/2008 |

\* cited by examiner

SUBSTRATE PROCESSING APPARATUS AND METHOD OF PRODUCING SEMICONDUCTOR DEVICE

CROSS-REFERENCE TO RELATED APPLICATIONS

This application is a division of U.S. patent application Ser. No. 16/283,609, filed on Feb. 22, 2019, which is based upon and claims the benefit of priority from Japanese Patent Application No. 2018-171649, filed Sep. 13, 2018, the entire contents of which are incorporated herein by reference.

FIELD

Embodiments described herein relate generally to a substrate processing apparatus and a method of producing a semiconductor device.

BACKGROUND

In forming a film on a substrate using plasma, the film may be also attached to a surface of an electrode to generate the plasma. When the film attached to the surface of the electrode comes off afterward, the detached film unfortunately may cause of generation of dust.

DETAILED DESCRIPTION

At least one embodiment provides a substrate processing apparatus and a method of producing a semiconductor device that prevent an electrode from causing generation of dust.

In general, according to at least one embodiment, a substrate processing apparatus includes a chamber to accommodate a substrate. The apparatus includes a stage to support the substrate in the chamber. The apparatus includes an electrode disposed above the stage and containing aluminum. The electrode generates plasma from gas supplied into the chamber to form a first film on the substrate by the plasma. The apparatus further includes a second film formed on a surface of the electrode and containing aluminum and fluorine or containing aluminum and oxygen.

Embodiments of the present disclosure will now be described with reference to the accompanying drawings.

Figure 1:
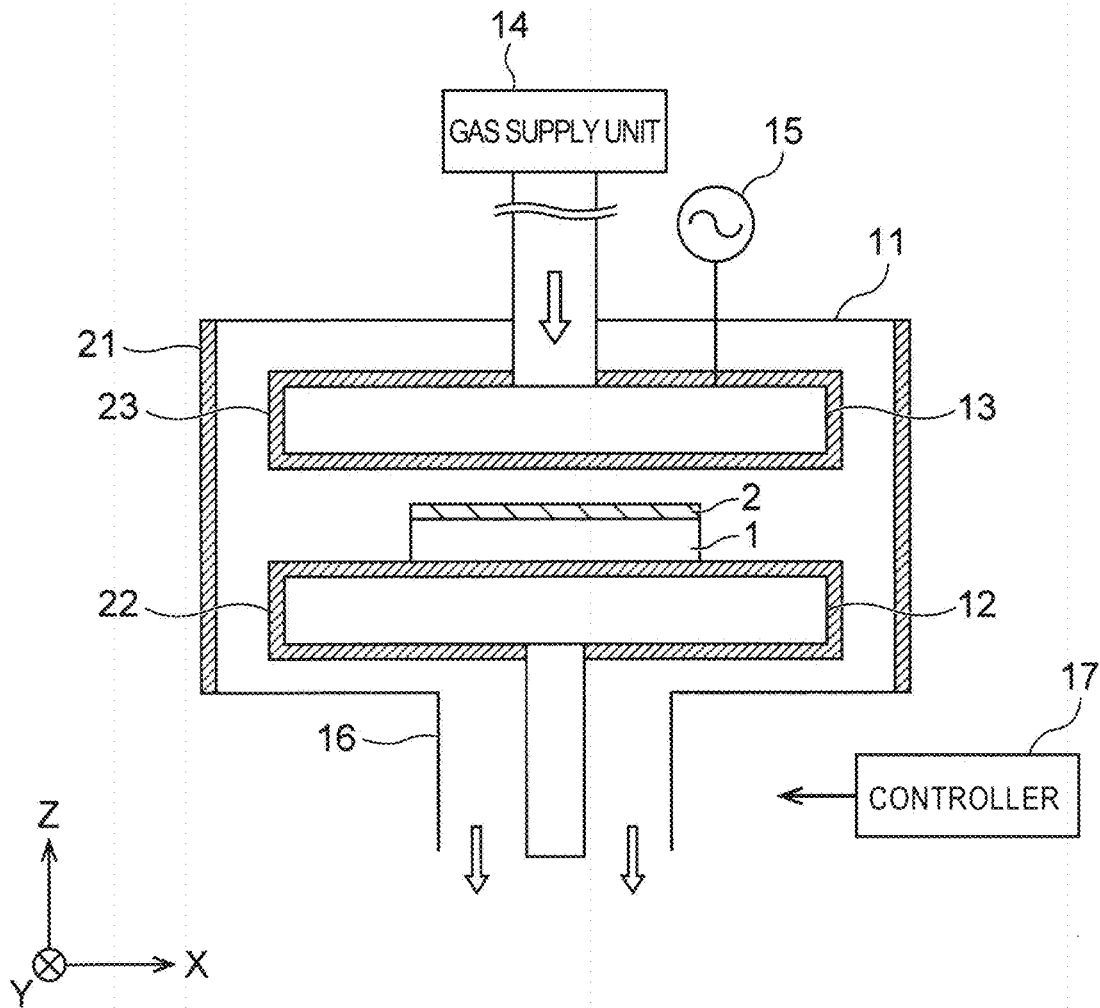
FIG. 1 is a cross-sectional view of a substrate processing apparatus according to at least one embodiment, schematically illustrating a configuration of the substrate processing apparatus.

First Embodiment FIG. 1 is a cross-sectional view of a substrate processing apparatus according to at least one embodiment, schematically illustrating a configuration of the substrate processing apparatus. The substrate processing apparatus in FIG. 1 is, for example, a plasma chemical vapor deposition (plasma CVD) apparatus to form a deposition film 2 on a substrate 1. The deposition film 2 is an example of the first film.

The substrate 1 is, for example, a semiconductor substrate such as a silicon substrate. FIG. 1 indicates an X-direction and a Y-direction, which are parallel to a surface of the substrate 1 and orthogonal to each other, and a Z-direction perpendicular to the surface of the substrate 1. In this specification, a +Z-direction is regarded as an upward direction, and a −Z-direction is regarded as a downward direction. The −Z-direction may conform to the gravity direction and may not conform to the gravity direction.

The deposition film 2 is, for example, a metal film containing tungsten (W). Specifically, examples include a WBC film where B represents boron, and C represents carbon. The deposition film 2 may be directly formed on the substrate 1 and may be formed on an interposed layer on the substrate 1. The deposition film 2 is used, for example, for a hard mask to process an underlying layer.

The substrate processing apparatus in FIG. 1 includes a chamber 11, a stage heater 12, an electrode 13, a gas supply unit 14, a power source 15, an evacuation vent 16, a controller 17, and coat films 21, 22, and 23. The coat films 21, 22, and 23 are an example of the second film.

The substrate 1 on which the deposition film 2 is to be formed is disposed in the chamber 11 and mounted on the stage heater 12. The stage heater 12 is capable of supporting the substrate 1 and heating the substrate 1 during formation of the deposition film 2.

The electrode 13 is disposed above the stage heater 12 in the chamber 11. The electrode 13 in at least one embodiment is a shower head electrode. Consequently, the gas supply unit 14 supplies gas into the chamber 11 through a passage in the electrode 13. Examples of the gas include $WF_6$ gas, which is W material gas, $B_2H_6$ gas, which is B material gas, $C_3H_6$ gas, which is C material gas, where F represents fluorine, and H represents hydrogen.

At this time, the power source 15 applies high-frequency power to the electrode 13. Thus, the electrode 13 generates plasma from the gas supplied into the chamber 11. The plasma is used to form the deposition film 2 on the substrate 1. The gas in the chamber 11 is then discharged from the evacuation vent 16.

The controller 17 controls various operations of the substrate processing apparatus. Examples of the controller 17 include a processor, an electric circuit, and a personal computer (PC). For example, the controller 17 controls heating by the stage heater 12, gas supply by the gas supply unit 14, and power application by the power source 15.

The coat film 21 is formed on surfaces of inner walls of the chamber 11, specifically, side surfaces of the inner walls. The coat film 22 is formed on surfaces of the stage heater 12. The coat film 23 is formed on surfaces of the electrode 13. In this manner, the coat films 21, 22, and 23 coat surfaces of elements inside of the chamber 11, such as the inner walls of the chamber 11, the stage heater 12, and the electrode 13. The coat films 21, 22, and 23 are, for example, metal films containing aluminum (Al) and fluorine (F).

Next, the coat film 23 on the electrode 13 according to at least one embodiment will be detailed.

When the coat film 23 is not formed on the surfaces of the electrode 13, the deposition film 2 may be attached to the surfaces of the electrode 13 as well while the deposition film 2 is being formed on the substrate 1. When the deposition film 2 attached to the surfaces of the electrode 13 comes off afterward, the detached deposition film 2 unfortunately causes generation of dust. When the deposition film 2 is a WBC film, the WBC film has such a high stress that adhesiveness of the deposition film 2 to the electrode 13 is considered to decrease and cause the deposition film 2 to be easily detached from the electrode 13. Consequently, unfavorable detachment of the deposition film 2 is more likely to occur when the deposition film 2 is a high-stress film. Further, this unfavorable detachment is more likely to occur when the electrode 13 is made of aluminum. The reason is that the electrode 13 made of aluminum is inferior in adhesiveness to the film to the electrode 13 made of other metals.

Figure 2:
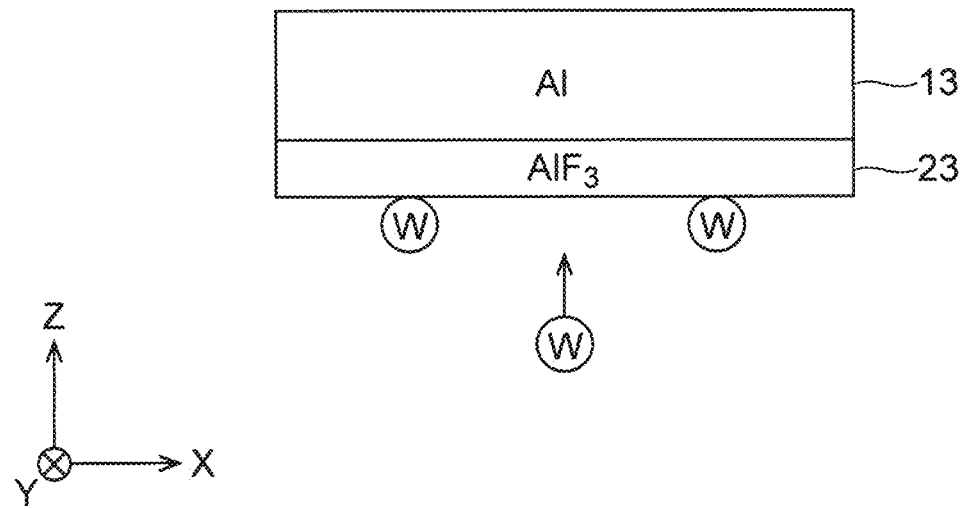
FIG. 2 is a cross-sectional view of an electrode according to at least one embodiment, specifically illustrating a coat film on the electrode.

In view of this, in at least one embodiment, the coat film 23 is formed on the surfaces of the electrode 13, and the coat film 23 is made of aluminum fluoride (see FIG. 2). FIG. 2 is a cross-sectional view of the electrode 13 according to the first embodiment, specifically illustrating the coat film 23 on the electrode 13. In this case, when the deposition film 2 is formed on the substrate 1, the deposition film 2 may be also attached to a surface of the coat film 23. However, because W atoms of the WBC film and F atoms of aluminum fluoride are bonded to each other with high bond energy, adhesiveness of the coat film 23 made of aluminum fluoride to the WBC film is high. According to at least one embodiment, therefore, the deposition film 2 attached to the surface of the coat film 23 becomes less likely to come off afterward to prevent the deposition film 2 from causing generation of dust.

The coat film 23 is formed on the surfaces of the electrode 13 by a method such as vacuum evaporation. Alternatively, other methods may be adopted. For example, when the coat film 23 made of aluminum fluoride is formed on the surfaces of the electrode 13 made of aluminum, plasma discharge with gas containing fluorine may be adopted to cause fluoridation reaction of the electrode 13 to form the coat film 23 on the surfaces of the electrode 13. It is noted that the coat film 23 may be formed on the surfaces of the electrode 13 made of materials other than aluminum. The above-described technique is also applicable to forming the coat film 21 on the surfaces of the inner walls of the chamber 11 and forming the coat film 22 on the surfaces of the stage heater 12.

Alternatively, it is considered to use not an aluminum fluoride film but a BC film, which is a film containing boron and carbon, for the coat film 23. In this case, because the BC film has high adhesiveness to the WBC film, the above-described generation of dust can be eliminated or minimized. However, because the BC film is etched by $NF_3$ gas (N represents nitrogen) for cleaning the interior of the chamber 11, it takes time and labor to form the coat film 23 on the surfaces of the electrode 13 each time the cleaning is performed. This disadvantageously induces a decrease in throughput and an increase in cost of the gas. Consequently, as in at least one, the coat film 23 is preferably an aluminum fluoride film.

When the coat film 21 is not formed on the surfaces of the inner walls of the chamber 11, the deposition film 2 may be attached to the surfaces of the inner walls of the chamber 11 as well while the deposition film 2 is being formed on the substrate 1. Similarly, when the coat film 22 is not formed on the surfaces of the stage heater 12, the deposition film 2 may be attached to the surfaces of the stage heater 12 as well while the deposition film 2 is being formed on the substrate 1. In at least one embodiment, therefore, not only the coat film 23 is formed on the surfaces of the electrode 13 but also the coat film 21 is formed on the surfaces of the inner walls of the chamber 11 and the coat film 22 is formed on the surfaces of the stage heater 12.

It is noted that among the chamber 11, the stage heater 12, and the electrode 13, the component to which the deposition film 2 is most likely to adhere is the electrode 13. The reason is that plasma is mainly generated between the electrode 13 and the substrate 1. In view of this, a merit of forming the coat film 23 on the surfaces of the electrode 13 is considered to be more significant than a merit of forming the coat film 21 on the surfaces of the inner walls of the chamber 11 and a merit of forming the coat film 22 on the surfaces of the stage heater 12. It is also noted that although the coat film 21 may be formed on all the surfaces of the inner walls of the chamber 11, the coat film 21 is preferably formed on only the side surfaces of the inner walls of the chamber 11 as illustrated in FIG. 1. The reason is that the deposition film 2 is more likely to adhere to the side surfaces of the inner walls than to the upper and lower surfaces of the inner walls.

The coat film 23 on the electrode 13 in at least one embodiment will be described in more detail. The following description is also applicable to the coat film 21 on the surfaces of the inner walls of the chamber 11 and the coat film 22 on the surfaces of the stage heater 12.

The coat film 23 in at least one embodiment contains aluminum and fluorine as described above. Here, it is desirable that a molarity of aluminum atoms in the coat film 23 be set at 25% or more and 50% or less of a molarity of aluminum atoms and fluorine atoms in the coat film 23. The reason is that when the molarity of aluminum atoms is more than 50%, less fluorine atoms exist on a surface of the coat film 23, and bonds between fluorine atoms and tungsten atoms become less likely to be formed. When the molarity of aluminum atoms is less than 25%, aluminum fluoride is less likely to solidify.

The coat film 23 in this embodiment may contain atoms of metal other than aluminum in addition to aluminum and fluorine. In this case, it is desirable that a molarity of aluminum atoms in the coat film 23 be set at 50% or more of a molarity of aluminum atoms and atoms of the other metal in the coat film 23. The reason is that it is desirable that the coat film 23 be stable as a solid, and that when the molarity of aluminum atoms is 50% or more, the coat film 23 is more likely to be stable as a solid.

Atoms of the other metal in this case are atoms of at least one of the following: alkaline earth metals other than beryllium, such as magnesium, calcium, strontium, barium, cesium, or radon; scandium; yttrium; and lanthanoids of atomic numbers 51 to 71. The reason is that when atoms of these metals form a metal fluoride film, the metal fluoride film is increased in boiling point and melting point and becomes more likely to be stable as a solid.

Although the coat film 23 in this embodiment contains aluminum and fluorine, fluorine may be replaced with another element. Examples of this element include oxygen. Because W atoms of the WBC film and O atoms of aluminum oxide are bonded to each other with high bond energy, adhesiveness of the coat film 23 made of aluminum oxide to the WBC film is improved.

Here, to generalize this description, metal atoms in the deposition film 2 will be referred to as first atoms, and atoms in the coat film 23 other than aluminum will be referred to as second atoms. When the deposition film 2 is a WBC film, the first atoms are tungsten. When the coat film 23 is an aluminum fluoride film, the second atoms are fluorine.

When the deposition film 2 is attached to the surface of the coat film 23, structures similar to molecules of the first atoms, the number of which is N, and the second atoms, the number of which is M, are generated (N and M each represent an integer of 1 or more). When the deposition film 2 is a WBC film and when the coat film 23 is an aluminum fluoride film, structures similar to $WF_6$ molecules are generated at an interface between the coat film 23 and the deposition film 2 (N=1, M=6). Because the $WF_6$ molecules have high bond energy, adhesiveness between the deposition film 2 and the coat film 23 is enhanced.

In view of this, when the deposition film 2 is attached to the surface of the coat film 23, and when structures similar to molecules of the N first atoms and the M second atoms are formed, it is desirable that bond energy of the molecules be high. For example, it is desirable that a formation enthalpy indicative of a quantity of the bond energy of the molecules be −100 kJ/mol or less. A $WF_6$ molecule is generated by bonding one tungsten atom to six fluorine atoms, and a formation enthalpy of the $WF_6$ molecule is −100 kJ/mol or less. Consequently, it is desirable that the second atoms be fluorine. Similarly, because a formation enthalpy of molecule of tungsten and oxygen is −100 kJ/mol or less, the second atoms may be oxygen.

Specifically, the formation enthalpy of the $WF_6$ molecule is −1721 kJ/mol. A formation enthalpy of a $WCl_6$ molecule is −496 kJ/mol (Cl represents chlorine). A formation enthalpy of a $WBr_6$ molecule is −184 kJ/mol (Br represents bromine). A formation enthalpy of a $WO_3$ molecule is −843 kJ/mol. A formation enthalpy of a $WS_2$ molecule is −240 kJ/mol (S represents sulfur). A formation enthalpy of a $WSe_2$ molecule is −185 kJ/mol (Se represents selenium). The formation enthalpy of any of these molecules is −100 kJ/mol or less. Therefore, when the first atoms are tungsten, the second atoms may be any of fluorine, chlorine, bromine, oxygen, sulfur, or selenium.

It is noted that the first atoms may be metal atoms other than tungsten. Examples of the first atoms include molybdenum (Mo). When the first atoms are molybdenum, the same second atoms as when the first atoms are tungsten are employable.

As described heretofore, in this embodiment, the coat film 23 containing aluminum and fluorine is formed on the surfaces of the electrode 13, and this electrode 13 is used to perform plasma CVD. According to at least one embodiment, therefore, the electrode 13 can be prevented from causing generation of dust.

It is noted that base material of the electrode 13 in at least one embodiment is aluminum, and the coat film 23 is formed on the surface of this base material (see FIG. 2). That is, the aluminum fluoride film is coated on the surfaces of the aluminum electrode. As described above, although adhesiveness between the aluminum electrode and the WBC film is inferior, adhesiveness between the aluminum fluoride film and the WBC film is high. According to this embodiment, therefore, the electrode aluminum can be prevented from causing generation of dust.

As described above, the technique of this embodiment is applicable to the electrode 13 other than the aluminum electrode, the deposition film 2 other than the WBC film, and the coat film 23 other than the aluminum fluoride film. For example, the electrode 13 may contain aluminum and other metal atoms. Moreover, the technique of this embodiment is applicable to other components in the chamber 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of producing a semiconductor device, the method comprising:
    accommodating a substrate in a chamber;
    supporting the substrate in the chamber by a stage; and
    generating, by an electrode, plasma from gas supplied into the chamber to form a first film on the substrate by the plasma, the electrode being disposed above the stage and having a surface on which a second film is formed, the first film comprising first atoms, which are metal atoms, the second film comprising aluminum and second atoms other than aluminum,
    wherein when the first atoms, a number of the first atoms being N, are bonded to the second atoms, a number of the second atoms being M, to form molecules, a formation enthalpy of the molecules formed by bonding the N first atoms to the M second atoms is −100 KJ/mol or less, N and M being integers of 1 or more.

2. The method according to claim 1, wherein the second atoms comprise fluorine atoms.

3. The method according to claim 1, wherein the first atoms comprise tungsten atoms, and the second atoms comprise at least one of fluorine, chlorine, bromine, oxygen, sulfur, or selenium atoms.

4. The method according to claim 1, wherein the first film comprises tungsten, boron and carbon.

5. A method of producing a semiconductor device, the method comprising:
    accommodating a substrate in a chamber;
    supporting the substrate in the chamber by a stage; and
    generating, by an electrode comprising aluminum, plasma from gas supplied into the chamber to form a first film on the substrate by the plasma, the electrode being disposed above the stage and having a surface on which a second film is formed, the second film comprising aluminum and fluorine.

6. The method of claim 5, wherein the first film comprises tungsten or molybdenum.

7. The method of claim 5, wherein the first film comprises tungsten, boron and carbon.

8. The method of claim 5, wherein a molarity of aluminum atoms in the second film is 25% or more and 50% or less.

9. The method of claim 5, a molarity of aluminum atoms in the second film is 50% or more of a total molarity of the aluminum atoms and metal atoms in the second film.

10. The method of claim 9, wherein the metal atoms comprise atoms of alkaline earth metals other than beryllium, scandium, yttrium or lanthanoids of atomic numbers 51 to 71.

11. The method of claim 5, wherein the stage comprises a stage heater.

12. The method of claim 5, wherein the electrode comprises a shower head electrode.

* * * * *